United States Patent [19]

Slepcevic

[11] 4,442,056
[45] Apr. 10, 1984

[54] ENCAPSULATION MOLD WITH GATE PLATE AND METHOD OF USING SAME

[76] Inventor: Dusan Slepcevic, 10370 Alpine Dr., Cupertino, Calif. 95014

[21] Appl. No.: 456,693

[22] Filed: Jan. 10, 1983

Related U.S. Application Data

[60] Continuation-in-part of Ser. No. 194,593, Dec. 6, 1980, Pat. No. 4,368,168, which is a division of Ser. No. 925,295, Jul. 17, 1978, Pat. No. 4,332,537.

[51] Int. Cl.³ .......................... B29C 1/00; B29D 3/00; B29D 31/00
[52] U.S. Cl. .................................. 264/161; 249/66 R; 249/85; 249/95; 264/163; 264/272.14; 264/272.17; 264/328.11; 264/334; 425/110; 425/121; 425/127; 425/554
[58] Field of Search ............ 264/259, 272.14, 272.15, 264/272.17, 275, 279, 328.11, 279.1, 161, 271.1, 334, 163, 272.17; 425/110, 116, 117, 121, 122, 123, 125, 127, 128, 129 R, 126 R, 553, 554; 249/66, 67, 84, 85, 110, 160, 83, 95

[56] References Cited

U.S. PATENT DOCUMENTS

| | | | |
|---|---|---|---|
| 2,163,814 | 6/1939 | Swarovski | 249/110 |
| 2,382,200 | 8/1945 | Brenner | 425/123 |
| 2,415,961 | 2/1947 | Nast | 425/129 |
| 2,500,258 | 3/1950 | Mazzoni | 425/123 |
| 2,650,648 | 3/1972 | Lambrecht | 425/129 |
| 3,753,634 | 8/1973 | Bliven et al. | 425/123 |
| 3,779,506 | 12/1973 | Adams | 249/110 |
| 4,044,984 | 8/1977 | Shimizu et al. | 249/95 |

*Primary Examiner*—Willard E. Hoag
*Attorney, Agent, or Firm*—Fliesler, Dubb, Meyer & Lovejoy

[57] ABSTRACT

A molding apparatus (10) has first and second opposed mold surfaces (22, 26) with the first mold surface (22) having a feed runner network (24). A mold structure (30) is supported by the second mold surface (26) and is spaced from the first mold surface (22). The mold structure (30) is adapted to hold a lead frame strip (38) and objects (39) held thereby in a plurality of openings (36). A gate plate (44) fits between the first mold surface (22) and the mold structure (30). The gate plate (44) has a plurality of gates or apertures (50) from a first (46) to a second (48) outfacing surface portion (46, 48) thereof. Set feed runners (71) can be removed from the molding apparatus (10) by motivating the gate plate (44) laterally across the mold structure (30). The runners are generally removed from the gate plate (44) by bending the gate plate (44) over a cylindrical surface (61) of small enough radius so that the set runners (71) cannot follow and are forced to separate gradually from the gate plate (44), eventually becoming completely free and falling away from the molding apparatus (10).

19 Claims, 7 Drawing Figures

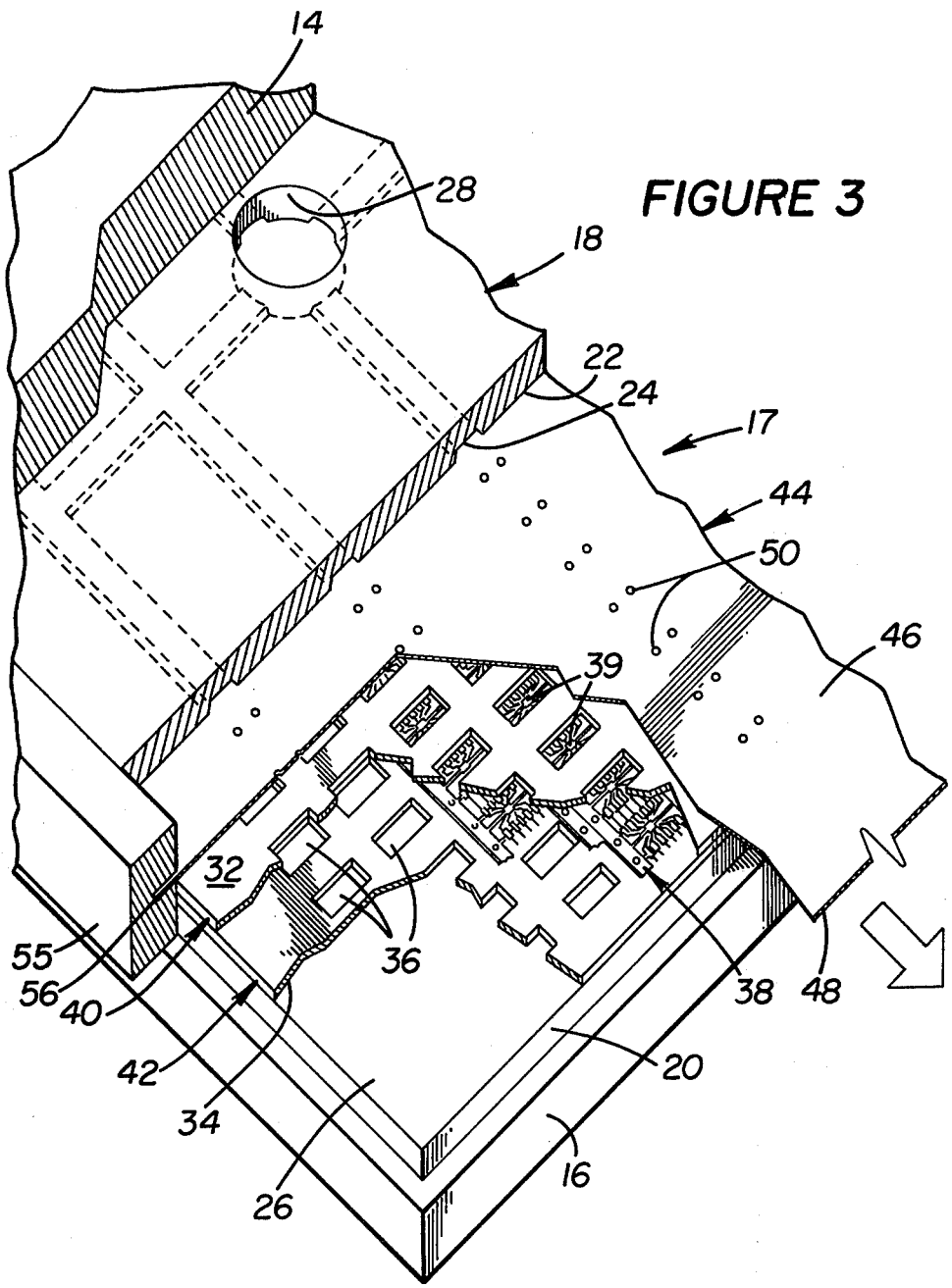

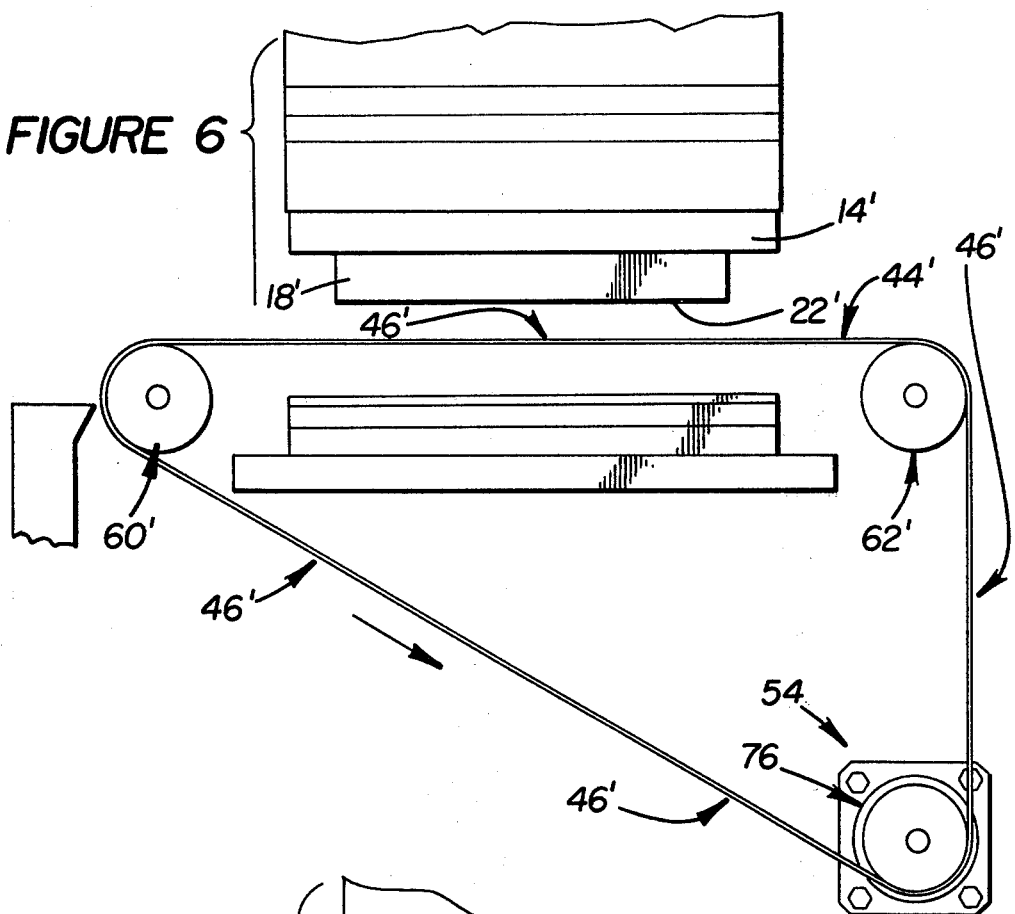
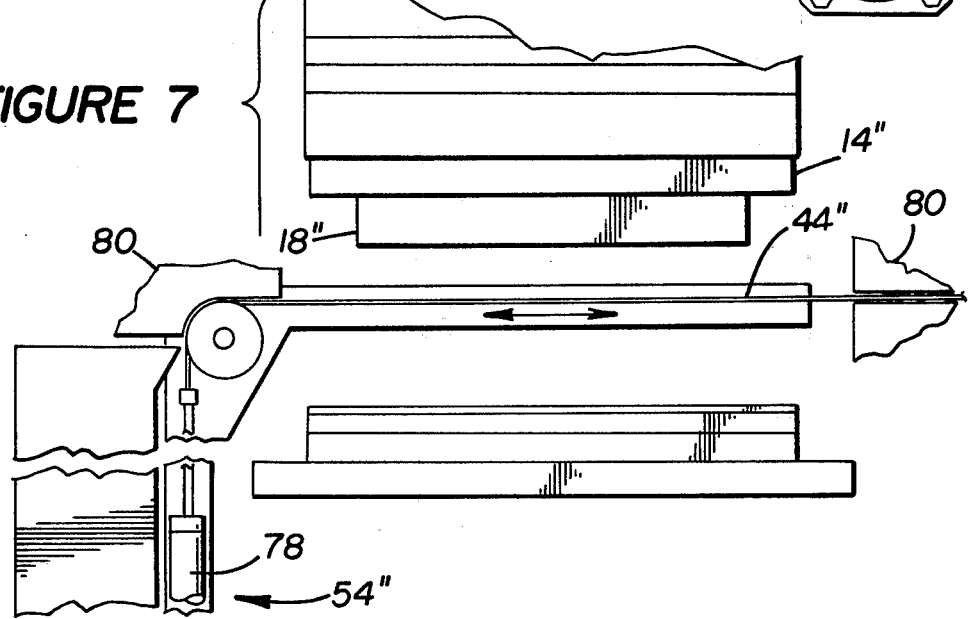

ENCAPSULATION MOLD WITH GATE PLATE AND METHOD OF USING SAME

CROSS-REFERENCE

This application is a continuation-in-part of co-pending U.S. patent application Ser. No. 194,593, filed Dec. 6, 1980, now U.S. Pat. No. 4,368,168 which is a division of co-pending U.S. patent application Ser. No. 925,295, filed July 17, 1978, now U.S. Pat. No. 4,332,537, issued June 1, 1982.

BACKGROUND OF THE INVENTION

1. Technical Field

The invention relates generally to a method and apparatus for encapsulating objects carried by a lead frame strip in an encapsulating material. More specifically, the invention relates to a method and apparatus for encapsulating electronic components such as semiconductor chips in plastic.

2. Background Art

Although not limited thereto, the present invention has particular suitability to the encapsulation of electronic components. For example, in the manufacture of semiconductor devices, it is common practice to provide lead frames in strip form, the strip having chip support pads spaced along the length thereof and leads extending lengthwise along the strip from adjacent to each pad. A semiconductor chip is then supported on each pad and electrical connections are made from the various leads to each chip. After this has been done, the strip is then placed in a mold having a cavity for each chip and a suitable plastic encapsulating material is then forced into the mold to encapsulate each chip, a portion of the leads therefrom and the electrical connections of the leads to the chip.

Typical molds now in use will accommodate eight lead frame strips, each having ten lead frames thereon, so that 80 semiconductor devices may be encapsulated on one shot. Other molds can handle twelve strips of ten lead frames each for simultaneous encapsulation of 120 devices.

Regardless of the particular number of devices to be encapsulated at a time, the typical present day mold comprises an upper and a lower mold member. With the upper mold member raised, the various lead frame strips are positioned on the lower mold member such that the portions to be encapsulated are in registration with the mold cavities formed in the lower mold member, there being, of course, one cavity for each of the strip portions. The upper mold member, which also has a complementary cavity formed thereinto for each strip portion, is then lowered onto the lower mold member.

The mold is further provided with a main injection opening through one of the mold members which communicates with relatively large feed runners that extend along the length of the strips, with relatively long gate runners which branch off of the feed runners and extend to each cavity. A suitable plastic, in liquid form, is then injected through the main opening, to fill the feed runners, gates and mold cavities.

After the plastic has hardened, the mold members are separated and the strips, with the encapsulating portions thereon, are removed from the mold. To prevent damage to the devices as the mold members are separated, ejection pins are provided on at least one of the mold members to engage the encapsulating devices and force them out of the mold cavities thereof during mold separation.

The molding process is then repeated with a new batch of lead frame strips.

Although the present molds provide an effective encapsulation, they have a number of definite disadvantages. A substantial amount of downtime exists. Each time a mold is used, the cavities, runners and gates must be checked and cleaned out, since a clogged runner or gate or a partially filled cavity will prevent the next molding operation from being carried out successfully. Time is also required to position each batch of lead frame strips in the mold prior to molding and to remove them from the cavities after molding. Additionally, it is customary to shut down for about an hour each day for a thorough cleaning of the mold.

The mold members are expensive, and require a considerable amount of precision machining to form the many cavities and the plastic distribution runners. Likewise, because of the many cavities and runners, they are difficult to clean and are relatively easy to damage during the usual mechanical cleaning thereof.

Typically, the plastic which is used hardens upon the polymerization thereof. As a consequence, the injected plastic which fills the distribution system and hardens therein is pure wastage—it cannot be reused. Because of the extensive distribution systems of present molds, the ratio of plastic in the distribution system to the plastic actually used for encapsulation is high and the wastage of the relatively expensive plastic material is substantial.

Present molds are also expensive because of the ejection pin systems. Typically, two ejection pins are provided for each device to eject it from the cavity in which it is formed. Thus, for a 120 cavity mold, 240 ejection pins are required. Further, the pins will cause surface deformation of the plastic where the pins engage the devices, detracting from the appearance of the finished product as well as providing less room on the surface thereof for application of legending or other indicia thereto.

In U.S. Pat. No. 4,332,537, and improved molding apparatus and method is disclosed which does not suffer from many of the drawbacks of the typical prior art molds. The mold and molding method taught in that patent utilize a cavity plate means which is removably positioned between first and second mold plates with the cavity plate flush against the first mold plate. The cavity plate means holds objects spaced from the first mold plate and has openings therethrough in registration with the portions of the objects which are to be encapsulated. Fluid plastic is forced through feed runners formed in the first mold plate and outwardly from the mold plate and into the openings of the cavity plate means to encapsulate the portions of the objects held thereby. As a result, the objects can be premounted on the cavity plate means prior to positioning of the cavity plate means between the mold plates. As a further result, the lower mold plate is completely flat for easy cleaning. Yet another result is that the feed runners in the first mold plate and the openings in the cavity plate means can be located to enable the maximum number of objects to be encapsulated for a given mold area. Still another result is that ejection pins may not be needed at all and if such are used they will be used only to remove hardened plastic from the feed runners of the first mold plate when the mold plates are moved apart for removal of the cavity plate means.

While an apparatus as disclosed in U.S. Pat. No. 4,332,537 solves the aforementioned problems of the typical molds of the prior art, room for further improvement still exists. For example, downtime is not reduced as much as would be desirable since the feed runners tend to stick to the cavity plate means. Also, cleaning off of the feed runners from the cavity plate means tends to produce undesirable wear on the cavity plate means. Further, it would be desirable to use smaller molds for producing equal numbers of encapsulated components because significant energy savings would result since much less energy is needed to heat a smaller mold to operating temperature than is needed to heat a larger mold to the same temperature. Still further, additional savings in plastic are desirable, not only because plastic is expensive, but also because making the plastic requires the expenditure of sizeable amounts of energy. Of even greater importance, because of the necessity for cleaning off the feed runners, the encapsulation mold of U.S. Pat. No. 4,332,537 is not ideal for adaptation for automation.

DISCLOSURE OF INVENTION

The present invention is directed to overcoming one or more of the problems set out above.

In accordance with one aspect of the invention, a mold is provided which is mountable between a pair of opposed mold bases which are mountable to a press, the mold being useful for encapsulating objects carried by a lead frame strip. The mold includes first and second opposed mold bases, with the first mold base carrying a first mold surface having a feed runner network and facing the second mold base. The first mold base has an injection opening leading to the feed runner network. A mold structure is provided having a first mold base facing surface which faces and is spaced from the first mold surface and a second mold base facing surface which faces and is supported by the second mold base. The mold structure has a plurality of openings extending from the first mold base facing surface towards the second mold base facing surface. The mold structure is adapted to hold the lead frame strip and the objects in position with the openings in registration with the objects. A gate plate is provided having first and second outfacing surface portions and a plurality of gates (apertures) from the first outfacing surface portion to the second outfacing surface portion. The apertures are in registration with the openings when the mold is closed. The gate plate is positioned between the first mold surface and the first mold facing surface with the first outfacing surface portion facing the first mold surface and the second outfacing surface portion facing the first mold base facing surface.

In accordance with another aspect of the present invention, a method is provided for encapsulating objects held by a lead frame strip. The method comprises loading the lead frame strip with the objects held thereby in a mold structure in a mold, the mold structure having a first mold base facing surface facing and spaced from a first mold surface carried by a first mold base. The first mold surface has a feed runner network. The mold structure has a second mold base facing surface facing and supported by a second mold base aligned opposingly to the first mold surface. The mold structure has a plurality of openings extending from the first mold base facing surface towards the second mold base facing surface with the objects in the openings. A gate plate having first and second generally planar outfacing surface portions and a plurality of apertures from the first outfacing surface portion to the second outfacing surface portion is positioned with the first outfacing surface portion facing the first mold surface and second outfacing surface portion facing the first mold base facing surface and with the apertures in registration with the openings. The first and second mold bases are moved together sufficiently so that the first mold surface contacts the first outfacing surface portion and connects the feed runner network to the apertures and the second outfacing surface portion contacts the first mold base facing portion. A fluid encapsulating material is injected into the feed runner network, through the apertures and into the openings in sufficient quantity to encapsulate the objects. The mold is maintained closed until the encapsulating material is set. The mold is then opened. The gate plate is moved, along with the set runners from the feed runner network, laterally across the first mold base facing surface sufficiently to fully separate the first mold base facing surface from the second outfacing surface portion. The set runners are removed from the first outfacing surface portion.

A mold and molding process in accordance with the present invention provides significant advances over previous mold designs and previous molding processes. Since the feed runner network deposits set runners only on the gate plate, and since the gate plate can be moved laterally out of the mold after it is opened along with the set runners, wear on the molding structure is greatly reduced. Also, feed runner material is not left behind on the molding structure so that it does not have to be cleaned off between runs. This greatly reduces downtime. Further, through use of a great plate which is laterally removable from the mold and disposes of the runner conveniently, one attains an apparatus which is ideally suited for automatic loading and unloading operations of molding structures such as the cavity plate means of U.S. Pat. No. 4,332,537. Indeed, two to three times as many molding operations can be carried out per unit time utilizing the improved mold and method of the present invention. As a result, smaller molds can be used for equal production. In such an instance, the amount of plastic runner material which is used can be reduced ten percent or more since long runners to far removed portions of a larger molding structure are not needed. This can provide significant savings in cost and energy consumption. Since abrasion of the cavity plate means is substantially eliminated when utilizing a mold and molding method in accordance with the present invention, cost for replacing worn out molding apparatus is significantly reduced.

BRIEF DESCRIPTION OF DRAWING

In the drawings, forming a part of this application, and in which like parts are designated by like reference numerals throughout:

FIG. 3 illustrates, in partial perspective view, partially cut away, an improved mold in accordance with the present invention;

FIG. 6 illustrates an alternate embodiment of a portion of the apparatus of FIG. 1;

FIG. 7 illustrates another alternate embodiment of a portion of the apparatus of FIG. 1.

BEST MODE FOR CARRYING OUT THE INVENTION

Figure 1:
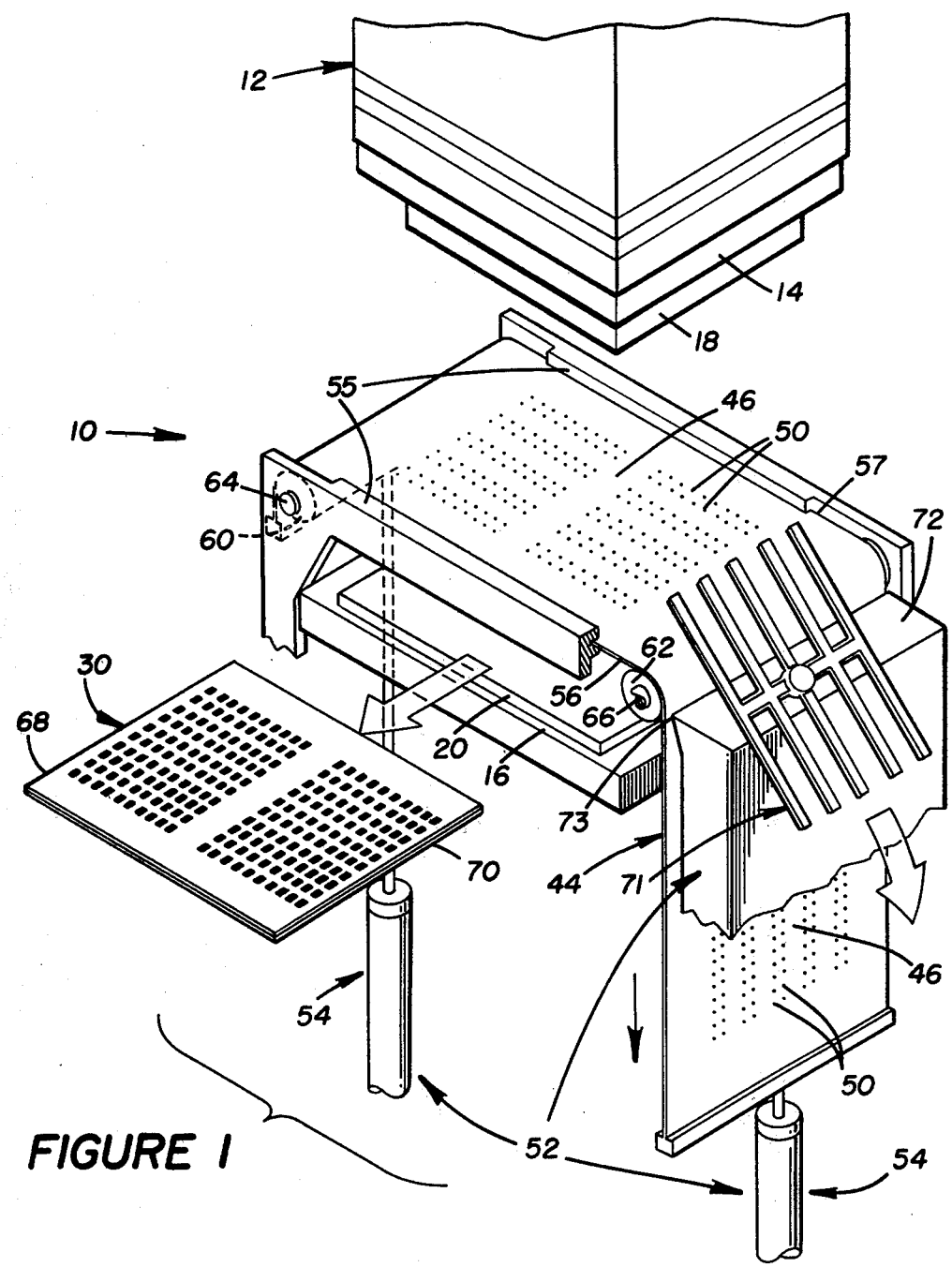
FIG. 1 illustrates, in perspective view with portions omitted for clarity, an apparatus in accordance with the present invention.

FIG. 1 shows a molding apparatus 10 in accordance with the present invention. A press 12 of a conventional nature has a pair of opposed first 14 and second 16 mold bases. A mold 17, which forms an important part of the molding apparatus 10, will be seen more clearly in FIGS. 3 and 4. The first mold base 14 has a first mold plate 18 mounted to it and the second mold base 16 has a second mold plate 20 mounted to it. The first mold base 18 has a first mold surface 22 which has a feed runner network 24. The second mold plate 20 has a second mold surface 26 which faces the first mold surface 22. An injection opening 28 (FIG. 3) in the first mold plate 18 communicates with the first mold surface 22 and more particularly communicates with the feed runner 24. In the embodiment illustrated, the first mold base 18 has the feed runner network 24 and injection is downwardly via the injection opening 28. It should be realized that this alignment is arbitrary and that the apparatus 10 will work as well if it is rotated as a unit at any angle, e.g., 180°.

Figure 4:
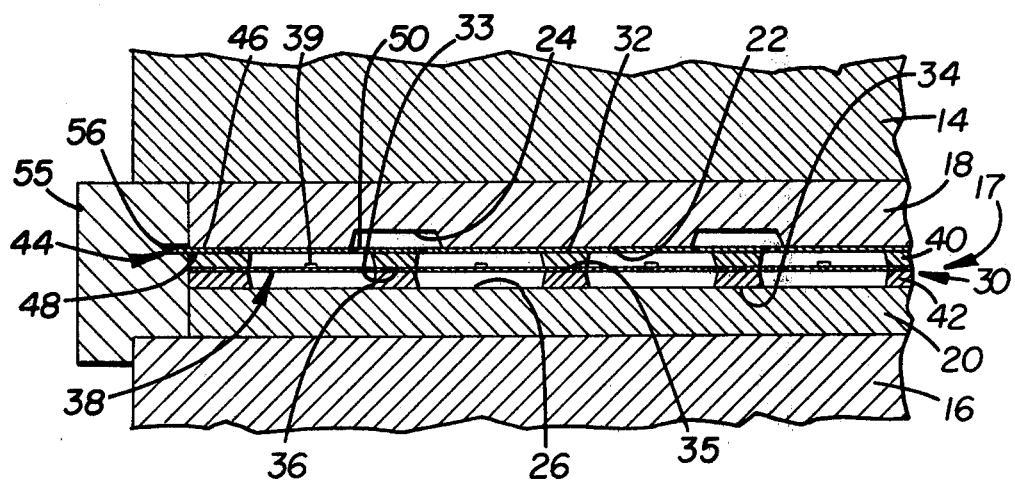
FIG. 4 illustrates a partial view taken along the line 4—4 of FIG. 2.
Figure 5:
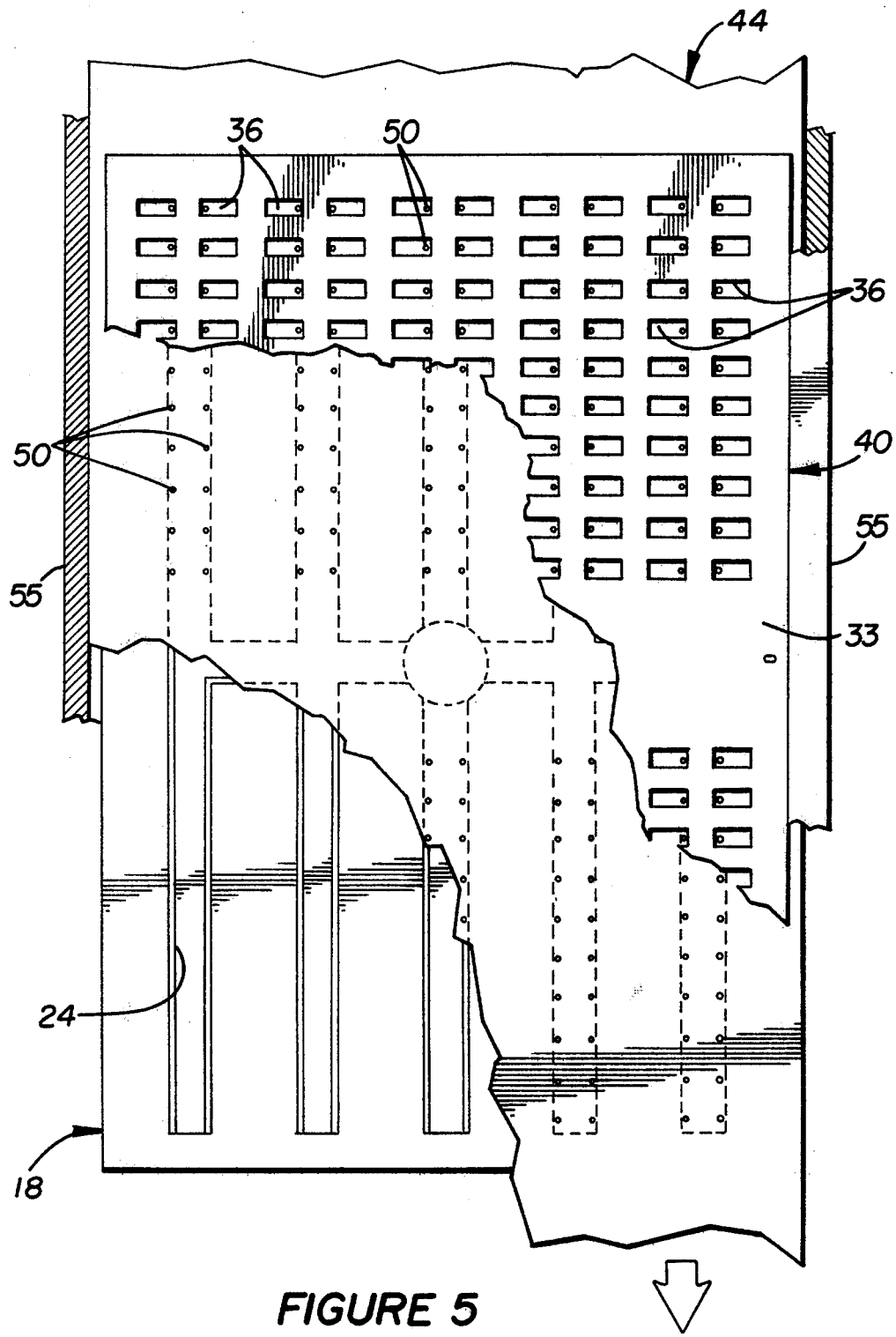
FIG. 5 illustrates, in a view taken from the bottom, with progressively broken away portions, a mold in accordance with the present invention.

A mold structure 30, seen best in FIG. 4, has a first mold base facing outer surface 32 which faces and is spaced from the first mold surface 22. The mold structure 30 also includes a second mold base facing outer surface 34 facing and supported by the second mold base 16. First 33 and second 35 facing inner surfaces 33, 35 also are part of the mold structure 30. The mold structure 30 has a plurality of openings 36 which extend from the first mold base facing surface 32 towards the second mold base facing surface 34. The mold structure 30 is adapted to hold a lead frame strip 38 and objects 39 to be encapsulated and held thereby in position with the openings 36 in registration with the objects 39. The preferred mold structure 30 is a cavity plate structure 30 which includes a first cavity plate 40 having the first inner surface 33 and a second cavity plate 42 having the second inner surface 35. The lead frame strip 38 is normally held between the first cavity plate 40 and the second cavity plate 42. The first outer surface 32 and a second outer surface 34 are generally defined by the respective plates 40 and 42 and are generally planar and generally oppositely facing. Through sandwiching of the lead frame strip 38 between the first inner surface 33 and the second inner surface 35, the lead frame strip 38 and the objects 39 attached thereto are generally completely spaced away from the first mold plate 18.

In accordance with the present invention, a gate plate 44 is provided which has a first outfacing surface portion 46 and a second outfacing surface portion 48. The gate plate 44 also has a plurality of small gates or apetures 50 (see FIG. 3) which extend from the first outfacing surface portion 46 to the second outfacing surface portion 48. The apertures 50 are much smaller than and are in registration with the openings 36 when the press 12 is closed. The gate plate 44 is positioned between the first mold surface 22 and the first outer surface 32 with the first outfacing surface portion 46 facing the first mold surface 22 and with the second outfacing surface portion 48 facing the first outer surface 32.

Figure 2:
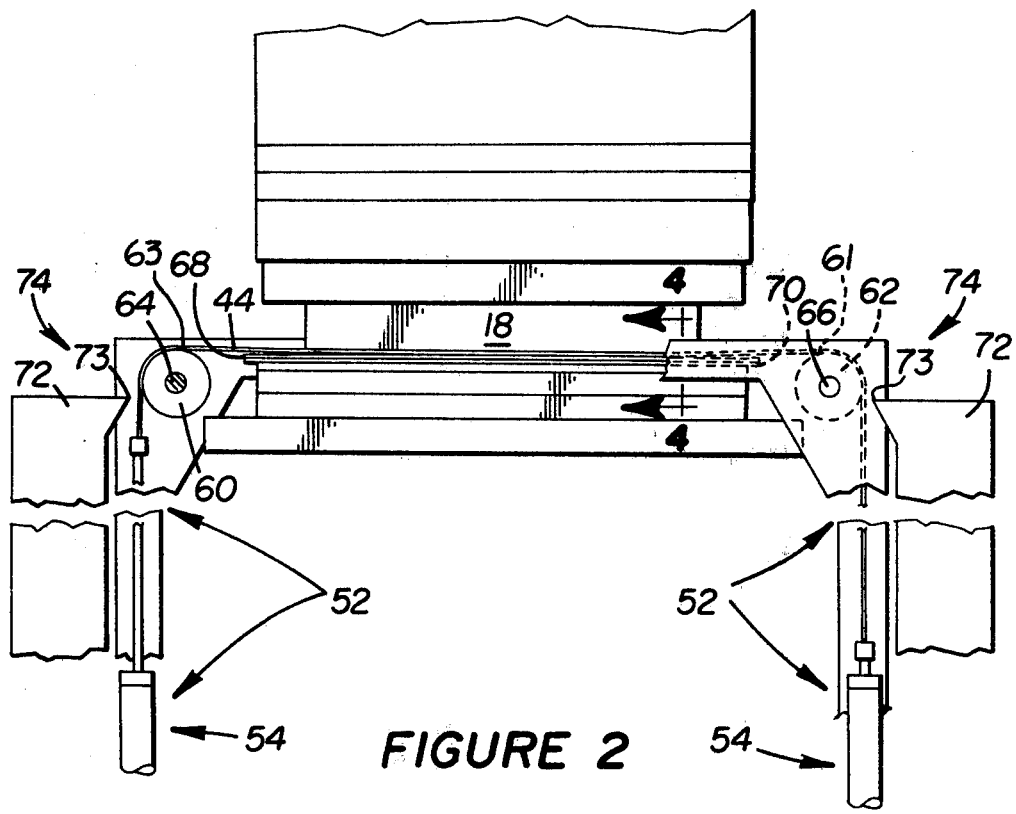
FIG. 2 illustrates, in side partially cut away view, a detail in the apparatus shown in FIG. 1.

Adverting now principally to FIGS. 1 and 2, there will be seen first separating means 52 for separating the outfacing surface portions 46, 48 of the gate plate 44 from the cavity plate structure 30 and from the first mold plate 18 when the first mold base 14 is moved apart from the second mold base 16. The separating means 52 also maintains the cavity plate structure 30 in contact with the second mold plate 20 during such separating. The particular separating means 52 illustrated in FIGS. 1 and 2 comprises a motor structure 54 connected to move the gate plate 44 laterally across and selectively out of and into alignment with the cavity plate structure 30 and the first mold plate 18. The separating means 52 comprises a pair of guides 55 for guiding the lateral edges 56, 57 of the gate plate 44 and a pair of rollers 60 and 62 mounted with axes 64, 66, respectively, generally parallel to one another and to a plane defined by the gate plate 44. The rollers 60, 62 are generally parallel to and spaced laterally from opposite ends 68 and 70 of the cavity structure 30. The gate plate 44 is entrained over the rollers 60, 62 and the motor structure 54 moves the gate plate 44 over the rollers 60, 62. The rollers 60 and 62 are generally located with cylindrical surfaces 61, 63 high enough to provide an upward lifting force on the gate plate 44 when the press 12 is open. This aids in the action of the separating means 52.

The gate plate 44 is generally made of a flexible material, preferably a resilient material such as spring stock so that it can be moved over the rollers 60, 62. Generally, the gate plate 44 will be quite thin, generally less than one millimeter in thickness. As the generally flexible gate plate 44 is moved over the rollers 60, 62 the set feed runner 71 from the feed runner network 24, which runner 71 is not flexible and has stuck with the gate plate 44 when the press 12 has been opened due to adhesion and to its connection via the apertures 50 to the set material in the openings 36, moves with the first outfacing surface 46 of the gate plate 44 and is separated therefrom as the flexible gate plate 44 moves and bends over the cylindrical surfaces 61, 63. An auxiliary stripping structure 72, having an edge 73, can be mounted near one or both of the rollers 60, 62 to aid in lifting off of the runner 71 which may be adhering to the first outfacing surface 50 of the gate plate 44. Thus, the stripping structure 72 and the edge 73, along with the cylindrical surfaces 61, 63 of the rollers 60, 62 serve as stripping means 74 for stripping off the runners 71 which adhere to the first outfacing surface portion 46 of the gate plate 44 following each encapsulating cycle.

The separating means 52 thus serves as means for moving the gate plate 44, along with the runners 71 originally deposited in the feed runner network 24 and left sticking to the first outfacing surface portion 46 of the gate plate 44, laterally across the first outer surface 32 sufficiently to move the first outfacing surface portion 46 selectively into and out of alignment with the first mold surface 22.

Referring to FIG. 6 there will be seen an alternate embodiment of the present invention wherein the motor means 54' comprises a rotary motor 76 and wherein the gate plate 44' comprises an endless belt 44' entrained over rollers 60' and 62'. The endless belt 44' generally has a plurality of first outfacing surface portions 46' for alternate alignment with the first mold surface 22'.

FIG. 7 illustrates an embodiment of the invention wherein the motor means 54" comprises a single double acting cylinder 78 and wherein a structure guide 80 directs the movement of the gate plate 44".

METHOD OF OPERATION

In accordance with the invention a method is provided for encapsulating objects 38 held by the lead frame strip 38. The method comprises loading the lead frame strip 38 with the objects 39 held thereby in a mold structure 30 which is positionable in a press 12. The mold structure 30 has a first mold base facing outer surface 32 facing and spaced from a first mold surface 22 carried by a first mold base 14. The first mold surface 22 has a feed runner network 24 formed therein. Mold structure 30 also has a second mold base facing outer surface 34 facing and supported by a second mold base 16. The second mold base 16 is aligned opposingly to the first mold surface 22. The mold structure has a plurality of openings 36 extending from the first mold base facing surface 32 towards the second mold base facing surface 34. The lead frame strip 38 is loaded in the mold structure 30 with the objects 39 carried by the lead frame strip 38 being in the openings 36. In the embodiment illustrated in the drawings, the mold structure 30 is in the nature of a cavity plate structure 30 which includes both a first cavity plate 40 and a second cavity plate 42. Loading is accomplished by positioning the lead frame strip 38 between the first cavity plate 40 and the second cavity plate 42 and positioning the cavity plate structure 30 atop the second mold surface 26 of the second mold plate 20.

The gate plate 44, having a first generally planar outfacing surface portion 46, a second generally planar outfacing surface portion 48 and a plurality of apertures 50 from the first outfacing surface portion 46 to the second outfacing surface portion 48, is positioned with the first outfacing surface portion 46 facing the first mold surface 22, the second outfacing surface portion 48 facing the first outer surface 32, and the apertures 50 in registration with the openings 36. Generally, the gate plate 44 will be positioned by being moved laterally across the first outer surface 32 sufficiently to align the first outer surface 32 with the second outfacing surface portion 48 and the apertures 50 with the openings 36 and with the feed runner 24.

The first mold base 14 and the second mold base 16 are moved together sufficiently so that the first mold surface 22 contacts the first outfacing surface portion 46 of the gate plate 44 and connects the feed runner network 24 to the apertures 50. The moving of the first mold base 14 and the second mold base 16 together also is sufficient so that the second outfacing surface portion 48 of the gate plate 44 contacts the first outer surface 32 of the cavity plate structure 30.

A fluid encapsulating material is injected into the feed runner network 24, generally via the injection opening 28, in sufficient quantity to encapsulate the objects 39 held within the openings 36. The press 12 is maintained closed until the encapsulating material is set. Thereafter, the press 12 is opened.

The gate plate 44, along with the set runners 71 from the feed runner network 24, is moved laterally across the first outer surface 32 sufficiently to fully separate the first outer surface 32 from the second outfacing surface 48. The set runners are removed from the first outfacing surface portion 46.

The lead frame strip 38 along with encapsulated objects 39 is then removed from the cavity plate structure 30, generally by removing the entire cavity plate structure 30 and then performing the necessary separation. A replacement cavity plate structure 30, with a replacement lead frame strip 38 is then inserted between the second mold plate 20 and the gate plate 44. The replacement cavity plate structure 30 is normally moved in orthogonally to the direction of motion of the gate plate 44 with the geometry being generally as shown in FIG. 1. In this manner, automated equipment may readily be used for loading and unloading cavity plate structures 30.

INDUSTRIAL APPLICABILITY

The present invention provides an improved molding apparatus 10 and method for plastic encapsulation of objects 39, such as semiconductor chips, held by a lead frame strip 38.

Other objects and advantages of the present invention will become apparent from a study of the specification, the drawings, and the accompanying claims.

I claim:

1. A method for encapsulating objects (39) held by a lead frame strip (38) comprising:
    (a) loading the lead frame strip (38) with the objects (39) held thereby in a cavity plate structure (30) having first (32) and second (34) oppositely facing generally planar outer surfaces (32, 34) and a plurality of openings (36) extending from said first outer surface (32) towards said second outer surface (34) with said objects (39) in said openings (36);
    (b) positioning said loaded cavity plate structure (30) in a molding apparatus (10) between first (18) and second (20) mold plates (18, 20) mounted to opposed mold bases (14, 16), said first mold plate (18) having a generally planar first surface (22) having a feed runner network (24) formed therein and said second mold plate (20) having a generally planar second surface (26) opposed to said first surface (22), with said second outer surface (34) of said cavity plate structure (30) facing said second surface (26) and said first outer surface (32) facing and spaced from said first surface (22);
    (c) positioning a gate plate (44) having first (46) and second (48) generally planar outfacing surface portions (46, 48) and a plurality of apertures (50) from said first outfacing surface portion (46) to said second outfacing surface portion (48) with said first outfacing surface portion (46) facing said first surface (22) of said first mold plate (18) and said second outfacing surface portion (48) facing said first outer surface (32) of said cavity plate structure (30) and with said apertures (50) in registration with said openings (36) in said cavity plate structure (30);
    (d) moving said first (18) and second (20) mold plates (18, 20) together sufficiently so that said first surface (22) contacts said first outfacing surface portion (46) and connects said feed runner network (24) to said apertures (50), said second outfacing surface portion (48) contacts said first outer surface (32) and said second outer surface (34) contacts said second surface (26);
    (e) injecting a fluid encapsulating material into said feed runner network (24), through said apertures

(50) and into said openings (36) in sufficient quantity to encapsulate said objects;

(f) maintaining the mold apparatus (10) closed until the encapsulating material has set;

(g) opening the molding apparatus (10);

(h) separating the gate plate (44), with the set runners (71) from the feed runner network (24) held to the first outfacing surface (46), orthogonally from the first surface (22);

(i) moving the gate plate (44) laterally across the first outer surface (32) sufficiently to fully separate the first outer surface (32) from the second outfacing surface portion (48); and (j) removing the set runners (71) from the first outfacing surface portion (46).

2. A method as set forth in claim 1, including the further steps of:

moving the gate plate (44) laterally across the first outer surface (32) until a first outfacing surface portion (46) is aligned facing the first surface (22); and repeating steps (a)–(j).

3. A method as set forth in claim 1, wherein said gate plate (44) is flexible and said removing step (j) comprises bending said gate plate (44) over a cylindrical surface (61) whereat said set runners (71) do not bend and are thereby separated from said gate plate (44).

4. A method for encapsulating objects (39) held by a lead frame strip (38) comprising:

(a) loading the lead frame strip (38) with the objects (39) held thereby in a mold structure (30) in a molding apparatus (10), said mold structure (30) having a first mold base facing surface (32) facing and spaced from a first mold surface (22) carried by a first mold base (14), said first mold surface (22) having a feed runner network (24) formed therein, and a second mold base facing surface (34) facing and supported by a second mold base (16) aligned opposingly to said first mold surface (22), said mold structure (30) having a plurality of openings (36) extending from said first mold base facing surface (32) towards said second mold base facing surface (34), with said objects in said openings (36);

(b) positioning a gate plate (44) having first (46) and second (48) generally planar outfacing surface portions (46, 48) and a plurality of apertures (50) from said first outfacing surface portion (46) to said second outfacing surface portion (48) with said first outfacing surface portion (46) facing said first mold surface (22) and said second outfacing surface portion (48) facing said first mold base facing surface (32) and with said apertures (50) in registration with said openings (36);

(c) moving said first (14) and second (16) mold bases (14, 16) together sufficiently so that said first mold surface (22) contacts said first outfacing surface portion (46) and connects said feed runner network (24) to said apertures (50) and said second outfacing surface portion (48) contacts said first mold base facing portion (32);

(d) injecting a fluid encapsulating material into said feed runner network (24) through said apertures (50) and into said openings (36) in sufficient quantity to encapsulate said objects;

(e) maintaining the molding apparatus (10) closed until the encapsulating material has set;

(f) opening the molding apparatus (10);

(g) moving said gate plate (44) along with the set runners (71) from the feed runner network (24) laterally across the first mold base facing surface (32) sufficiently to fully separate the first mold base facing surface (32) from the second outfacing surface portion (48); and (h) removing the set runners (71) from the first outfacing surface portion (46).

5. A method as set forth in claim 4, wherein said positioning step (b) comprises moving said gate plate (44) laterally across the first mold base facing surface (32) sufficiently to align the first mold base facing surface (32) with the second outfacing surface portion (48).

6. A method as set forth in claim 5, further including the steps of:

(i) removing the lead frame strip (38) with the encapsulated objects (39) from said mold structure (30); and (j) repeating steps (a)–(i) a plurality of times.

7. A molding apparatus (10) mountable to a press (12) and useful for encapsulating objects (39) carried by a lead frame strip (38), comprising:

(a) first (14) and second (16) opposed mold bases (14, 16), said first mold base (14) having a first surface (22) having a feed runner network (24) and facing said second mold base (16) and having an injection opening (22) therethrough to said first surface (22);

(b) a mold structure (30) having a first mold base facing surface (32) which faces and is spaced from said first mold surface (22) and a second mold base facing surface (34) which faces and is supported by said second mold base (16), said mold structure (30) having a plurality of openings (36) extending from said first mold base facing surface (32) towards said second mold base facing surface (34), said mold structure (30) being adapted to hold said lead frame strip (38) and said objects (39) in position with said openings (36) in registration with said objects (39);

(c) a gate plate (44) having first (46) and second (48) outfacing surface portions (46, 48) and a plurality of apertures (50) from said first outfacing surface portion (46) to said second outfacing surface portion (48), said apertures (50) being in registration with said openings (36) when said apparatus (10) is closed, said gate plate (44) being positioned between said first mold surface (22) and said first mold base facing surface (32) with said first outfacing surface portion (46) facing said first mold surface (22) and said second outfacing surface portion (48) facing said first mold base facing surface (32); and means (52) for moving said gate plate (44), when said apparatus (10) is open, along with set runners (71) originally deposited in said feed runner network (24), laterally across said first mold base facing surface (22) sufficiently to move said first outfacing surface portion (46) selectively into and out of alignment with said first mold surface (22).

8. A molding apparatus (10) as set forth in claim 1, further including:

means (72) for stripping said set runners (71) from said first outfacing surface portion (46) as said gate plate (44) moves out of alignment with said first mold surface (22).

9. A molding apparatus (10) as set forth in claim 1, when said moving means (52) comprises a pair of rollers (60, 62) mounted with axes (64, 66) generally parallel to one another and to a plane defined by said gate plate (44), said rollers (60, 62) being generally parallel to and spaced laterally from opposite ends (68, 70) of said molding structure (30), said gate plate (44) being in contact with said rollers (60, 62) and a motor structure (54) connected to move said outfacing surface portion (46) of said gate plate (44) laterally across and selectively out of and into alignment with said mold structure (30) and said first mold plate (18), said motor structure (54) moving said gate plate (44) over said rollers (60, 62).

10. In an apparatus (10) for encapsulating objects (39) carried by a lead frame strip (38) which comprises (a) first (14) and second (16) opposed mold bases (14, 16); (b) first (18) and second (20) mold plates (18, 20) having respective first (22) and second (26) generally planar mold surfaces (22, 26), said first (18) and second (20) mold plates (18, 20) being affixed respectively to said first (14) and second (16) mold bases (14, 16) in opposed relation; (c) a cavity plate structure (30) having first (32) and second (34) spaced apart and oppositely facing generally planar outer surfaces (32, 34), first (33) and second (35) facing inner surfaces (33, 35) and a plurality of openings (36) therethrough from said first outer surface (32) to said second outer surface (34), said first outer surface (32) facing said first mold surface (22), said second outer surface (34) facing said second mold surface (26), said first (33) and second (35) inner surfaces (33, 35) being of a construction sufficient to hold said lead frame strip (38) and said objects (39) carried thereby in position relative to said mold plates (16, 18) with said lead frame strip (38) and objects (39) all being completely spaced away from said first mold plate (18) and said openings (36) being in registration with said objects carried by said lead frame strip (38) and held by said cavity plate structure (30) when said cavity plate structure (30) is positioned between said first (18) and second (20) mold plates (18, 20); (d) an injection opening (28) through said first mold plate (18) to said first mold surface (22); and (e) a feed runner network (24) formed into said first mold surface (22); an improvement comprising:

a gate plate (44) having a first outfacing surface portion (46), a second outfacing surface portion (48) and a plurality of apertures (50) therethrough from said first outfacing surface portion (46) to said second outfacing surface portion (48), said gate plate (44) being positioned between said first mold plate (18) and said cavity plate structure (30) with said first mold surface (22) in contact with said first outfacing surface portion (46) and said second mold surface (26) in contact with said first outer surface (34), said apertures (50) being in registration with said openings (36) in said cavity plate structure (30); and means (52) for moving said gate plate (44), when said apparatus (10) is open, along with set runners (71) originally deposited in said feed runner network (24), laterally across said first mold base facing surface (22) sufficiently to move said first outfacing surface portion (46) selectively into and out of alignment with said first mold surface (22).

11. An apparatus (10) as set forth in claim 10, further including:

separating means (52) for separating said outfacing surface portions (46, 48) of said gate plate (44) from said cavity plate structure (30) and from said first mold plate (18) when said first (14) and second (16) mold bases (14, 16) are moved apart while maintaining said cavity plate structure (30) in contact with said second mold plate (20).

12. An apparatus (10) as set forth in claim 11, further including:

stripping means (74) for stripping off set runners (71) which adhere to said first outfacing surface portion (46) of said gate plate (44) following each encapsulating cycle.

13. An apparatus (10) as set forth in claim 11 wherein said separating means (52) comprises a motor structure (54) connected to move said gate plate (44) laterally across and selectively out of and into alignment with said cavity plate structure (30) and said first mold plate (18).

14. An apparatus (10) as set forth in claim 13 when said separating means (52) comprise a pair of rollers (60, 62) mounted with axes (64, 66) generally parallel to one another and to a plane defined by said gate plate (44), said rollers (60, 62) being generally parallel to and spaced laterally from opposite ends (68, 70) of said cavity plate structure (30), said gate plate (44) being in contact with said rollers (60, 62) and said motor structure (54) moving said gate plate (44) over said rollers (60, 62).

15. A method as set forth in claim 4, wherein said gate plate (44) is flexible and said removing step (h) comprises bending said gate plate (44) over a cylindrical surface (61) whereat said set runners (71) do not bend and are thereby separated from said gate plate (44).

16. A molding apparatus (10) mountable to a press (12) and useful for encapsulating objects (39) carried by a lead frame strip (38), comprising:

(a) first (14) and second (16) opposed mold bases (14, 16), said first mold base (14) having a first surface (22) having a feed runner network (24) and facing said second mold base (16) and having an injection opening (22) therethrough to said first surface (22);

(b) a mold structure (30) having a first mold base facing surface (32) which faces and is spaced from said first mold surface (22) and a second mold base facing surface (34) which faces and is supported by said second mold base (16), said mold structure (30) having a plurality of openings (36) extending from said first mold base facing surface (32) towards said second mold base facing surface (34), said mold structure (30) being such as to hold said lead frame strip (38) and said objects (39) in position with said openings (36) in registration with said objects (39) spaced from said facing surfaces (32, 34);

(c) a gate plate (44) having first (46) and second (48) outfacing surface portions (46, 48) and a plurality of apertures (50) from said first outfacing surface portion (46) to said second outfacing surface portion (48), said apertures (50) being in registration with said openings (36) when said apparatus (10) is closed, said gate plate (44) being positioned between said first mold surface (22) and said first mold base facing surface (32) with said first outfacing surface portion (46) facing said first mold surface (22) and said second outfacing surface portion (48) facing said first mold base facing surface (32).

17. In an apparatus (10) for encapsulating objects (39) carried by a lead frame strip (38) which comprises (a) first (14) and second (16) opposed mold bases (14, 16); (b) first (18) and second (20) mold plates (18, 20) having respective first (22) and second (26) generally planar mold surfaces (22, 26), said first (18) and second (20) mold plates (18, 20) being affixed respectively to said first (14) and second (16) mold bases (14, 16) in opposed relation; (c) a cavity plate structure (30) having first (32) and second (34) spaced apart oppositely facing generally planar outer surfaces (32, 34), first (33) and second (35) facing inner surfaces (33, 35) and a plurality of openings (36) therethrough from said first outer surface (32) to said second outer surface (34), said first outer surface (32) facing said first mold surface (22), said second outer surface (34) facing said second mold surface (26), said first (33) and second (35) inner surfaces (33, 35) being of a construction sufficient to hold said lead frame strip (38) and said objects (39) carried thereby in position relative to said mold plates (16, 18) with said lead frame strip (38) and objects (39) all being completely spaced away from said first and second mold plates (18, 20) and said openings (36) being in registration with said objects carried by said frame strip (38) and held by said cavity plate structure (30) when said cavity plate structure (30) is positioned between said first (18) and second (20) mold plates (18, 20); (d) an injection opening (28) through said first mold plate (18) to said first mold surface (22); and (e) a feed runner network (24) formed into said first mold surface (22); an improvement comprising:

a gate plate (44) having a first outfacing surface portion (46), a second outfacing surface portion (48) and a plurality of apertures (50) therethrough from said first outfacing surface portion (46) to said second outfacing surface portion (48), said gate plate (44) being positioned between said first mold plate (18) and said cavity plate structure (30) with said first mold surface (22) in contact with said first outfacing surface portion (46) and said secnd mold surface (26) in contact with said first outer surface (34), said apertures (50) being in registration with said openings (36) in said cavity plate structure (30).

18. A mold (17) mountable between a pair of opposed mold bases (14, 16) mounted to a press (12) and useful for encapsulating objects (39) carried by a lead frame strip (38), comprising:

first (18) and second (20) mold plates (18, 20) having respective first (22) and second (26) generally planar surfaces (22, 26), said first mold plate (18) having an injection opening (28) therethrough to said first surface (22), said first surface (22) having a feed runner network (24) formed therein, said mold plates (18, 20) being adapted to be affixed to said pair of opposed mold bases (14, 16) in opposed relation;

a cavity plate structure (30) having first (32) and second (34) oppositely facing generally planar outer surfaces (32, 34) and a plurality of openings (36) from said first outer surface (32) to said second outer surface (34), said first (32) and second (34) outer surfaces (32, 34) facing, respectively, said first (22) and second (26) surfaces (22, 26), said cavity plate structure (30) being adapted to hold said lead frame strip (38) and said objects (39) in position relative to said mold plates (18, 20) with said lead frame strip (38) and objects (39) all being completely spaced away from said first and second mold plates (18, 20) and said openings (36) being in registration with said objects (39) carried by said lead frame strip (38) and held by said cavity plate structure (30) when said cavity plate structure 30 is positioned between said mold plates (18, 20);

a gate plate (44) having first (46) and second (48) generally planar outfacing surface portions (46, 48) and a plurality of apertures (50) from said first outfacing surface portion (46) to said second outfacing surface portion (48), said gate plate (44) being positioned between said first mold plate (18) and said cavity plate structure (30) with said first outfacing surface portion (46) facing said first surface (22) and said second outfacing surface portion (48) facing said first outer surface (32) of said cavity plate structure (30), said apertures (50) being in registration with said openings (36) in said cavity plate structure (30).

19. A mold (17) mountable between a pair of opposed mold bases (14, 16) mounted to a press (12) and useful for encapsulating objects (39) carried by a lead frame strip (38), comprising:

first (18) and second (20) mold plates (18, 20) having respective first (22) and second (26) generally planar surfaces (22, 26), said first mold plate (18) having an injection opening (28) therethrough to said first surface (22), said first surface (22) having a feed runner network (24) formed therein, said mold plates (18, 20) being adapted to be affixed to said pair of opposed mold bases (14, 16) in opposed relation;

a cavity plate structure (30) having first (32) and second (34) oppositely facing generally planar outer surfaces (32, 34) and a plurality of openings (36) from said first outer surface (32) to said second outer surface (34), said first (32) and second (34) outer surfaces (32, 34) facing, respectively, said first (22) and second (26) surfaces (22, 26), said cavity plate structure (30) being adapted to hold said lead frame strip (38) and said objects (39) in position relative to said mold plates (18, 20) with said lead frame strip (38) and objects (39) all being completely spaced away from said first mold plate (18) and said openings (36) being in registration with said objects (39) carried by said lead frame strip (38) and held by said cavity plate structure (30) when said cavity plate structure 30 is positioned between said mold plates (18, 20);

a gate plate (44) having first (46) and second (48) generally planar outfacing surface portions (46, 48) and a plurality of apertures (50) from said first outfacing surface portion (46) to said second outfacing surface portion (48), said gate plate (44) being positioned between said first mold plate (18) and said cavity plate structure (30) with said first outfacing surface portion (46) facing said first surface (22) and said second outfacing surface portion (48) facing said first outer surface (32) of said cavity plate structure (30), said apertures (50) being in registration with said openings (36) in said cavity plate structure (30); and means (52) for moving said gate plate (44), when said apparatus (10) is open, along with set runners (71) originally deposited in said feed runner network (24), laterally across said first mold base facing surface (22) sufficiently to move said first outfacing surface portion (46) selectively into and out of alignment with said first mold surface (22).

* * * * *

UNITED STATES PATENT AND TRADEMARK OFFICE
CERTIFICATE OF CORRECTION

PATENT NO. : 4,442,056
DATED : April 10, 1984
INVENTOR(S) : Dusan Slepcevic

It is certified that error appears in the above-identified patent and that said Letters Patent is hereby corrected as shown below:

In the ABSTRACT, last line, after "apparatus (10)." should be the following sentence:

-- A molding method utilizing the gate plate (44) is likewise set forth. --.

Column 1, line 41, "on" should be --at--.

Column 7, line 9, "objects 38" should be --objects 39--.

Column 10, line 59, "claim 1," should be --claim 7,--.

Column 10, line 65, "claim 1," should be --claim 7,--.

Signed and Sealed this

Sixteenth Day of October 1984

[SEAL]

Attest:

Attesting Officer

GERALD J. MOSSINGHOFF

Commissioner of Patents and Trademarks